United States Patent
Lee et al.

(10) Patent No.: US 9,312,405 B2
(45) Date of Patent: Apr. 12, 2016

(54) THIN FILM TYPE SOLAR CELL AND FABRICATION METHOD THEREOF

(75) Inventors: Sung-Chul Lee, Yongin-si (KR); Doo-Youl Lee, Yongin-si (KR); Young-Jin Kim, Yongin-si (KR); Young-Su Kim, Yongin-si (KR); Young-Soo Kim, Yongin-si (KR); Dong-Hun Lee, Yongin-si (KR)

(73) Assignee: Intellectual Keystone Technology LLC, McLean, VA (US)

( * ) Notice: Subject to any disclaimer, the term of this patent is extended or adjusted under 35 U.S.C. 154(b) by 558 days.

(21) Appl. No.: 13/560,951

(22) Filed: Jul. 27, 2012

(65) Prior Publication Data

US 2013/0228218 A1  Sep. 5, 2013

(30) Foreign Application Priority Data

Mar. 2, 2012 (KR) ........................ 10-2012-0022030

(51) Int. Cl.
  *H01L 21/00* (2006.01)
  *H01L 31/0224* (2006.01)
  *H01L 31/068* (2012.01)
  *H01L 31/18* (2006.01)

(52) U.S. Cl.
  CPC .... *H01L 31/022441* (2013.01); *H01L 31/0682* (2013.01); *H01L 31/1804* (2013.01); *Y02E 10/547* (2013.01); *Y02P 70/521* (2015.11)

(58) Field of Classification Search
  CPC ............................................. H01L 31/022441
  USPC .................................... 438/57; 257/E31.124
  See application file for complete search history.

(56) References Cited

U.S. PATENT DOCUMENTS

| | | | |
|---|---|---|---|
| 4,131,488 A * | 12/1978 | Lesk et al. | 438/71 |
| 4,234,352 A | 11/1980 | Swanson | |
| 5,053,083 A | 10/1991 | Sinton | |
| 7,339,110 B1 * | 3/2008 | Mulligan et al. | 136/256 |

(Continued)

FOREIGN PATENT DOCUMENTS

| | | |
|---|---|---|
| EP | 2 161 757 A2 | 3/2010 |
| EP | 2 395 554 A2 | 12/2011 |

(Continued)

OTHER PUBLICATIONS

EPO Search Report dated Jun. 11, 2013, for corresponding European Patent application 13157489.9, (7 pages).

(Continued)

*Primary Examiner* — Igwe U Anya

(57) ABSTRACT

A method of fabricating a solar cell includes forming a doped portion having a first conductive type on a semiconductor substrate, growing an oxide layer on the semiconductor substrate, forming a plurality of recess portions in the oxide layer, further growing the oxide layer on the semiconductor substrate, forming a doped portion having a second conductive type on areas of the semiconductor substrate corresponding to the recess portions, forming a first conductive electrode electrically coupled to the doped portion having the first conductive type, and forming a second conductive electrode on the semiconductor substrate and electrically coupled to the doped portion having the second conductive type, wherein a gap between the doped portions having the first and second conductive types corresponds to a width of the oxide layer formed by further growing the oxide layer.

13 Claims, 5 Drawing Sheets

(56) References Cited

U.S. PATENT DOCUMENTS

| | | | |
|---|---|---|---|
| 7,388,147 B2 | 6/2008 | Mulligan et al. | |
| 7,897,867 B1* | 3/2011 | Mulligan et al. | 136/256 |
| 2006/0130891 A1 | 6/2006 | Carlson | |
| 2007/0256728 A1* | 11/2007 | Cousins | 136/252 |
| 2008/0035198 A1 | 2/2008 | Teppe et al. | |
| 2008/0202576 A1 | 8/2008 | Hieslmair | |
| 2009/0050190 A1 | 2/2009 | Nishida et al. | |
| 2009/0223549 A1 | 9/2009 | Ounadjela et al. | |
| 2010/0029039 A1 | 2/2010 | Shan et al. | |
| 2010/0059109 A1 | 3/2010 | Nakayashiki et al. | |
| 2010/0078069 A1 | 4/2010 | Ide | |
| 2010/0193027 A1 | 8/2010 | Ji et al. | |
| 2010/0319767 A1 | 12/2010 | Sauar | |
| 2011/0027463 A1* | 2/2011 | Riordon et al. | 427/75 |
| 2011/0041902 A1 | 2/2011 | Krokoszinski et al. | |
| 2011/0061732 A1* | 3/2011 | Yang et al. | 136/258 |
| 2011/0303280 A1* | 12/2011 | Pawlak et al. | 136/256 |
| 2012/0273040 A1* | 11/2012 | Kim | H01L 31/0682 136/256 |
| 2012/0285518 A1* | 11/2012 | De Souza et al. | 136/255 |
| 2013/0164878 A1* | 6/2013 | Cousins et al. | 438/71 |
| 2013/0164879 A1* | 6/2013 | Cousins et al. | 438/71 |

FOREIGN PATENT DOCUMENTS

| | | |
|---|---|---|
| JP | 2010-519731 A | 6/2010 |
| JP | 2010-283406 A | 12/2010 |
| JP | 2010-283408 A | 12/2010 |
| JP | 2011-3938 A | 1/2011 |
| JP | 2011-009733 A | 1/2011 |
| JP | 2011-233656 | 11/2011 |
| KR | 10-2010-0057459 A | 5/2010 |
| KR | 10-2010-0068833 A | 6/2010 |
| KR | 10-2010-0073645 A | 7/2010 |
| KR | 10-2010-0089473 A | 8/2010 |
| KR | 10-2010-0089538 A | 8/2010 |
| KR | 10-2010-0102254 A | 9/2010 |
| KR | 10-2010-0128726 | 12/2010 |
| KR | 10-2010-0136462 | 12/2010 |
| WO | WO 2010/137927 A2 | 12/2010 |

OTHER PUBLICATIONS

Patent Abstracts of Japan, and English machine translation of Japanese Publication 2011-233656, dated Nov. 17, 2011, listed above, (31 pages).

* cited by examiner

THIN FILM TYPE SOLAR CELL AND FABRICATION METHOD THEREOF

CROSS-REFERENCE TO RELATED APPLICATION

This application claims priority to and the benefit of Korean Patent Application No. 10-2012-0022030, filed on Mar. 2, 2012, in the Korean Intellectual Property Office, the disclosure of which is incorporated herein in its entirety by reference.

BACKGROUND

1. Field

One or more embodiments of the present invention relate to a solar cell.

2. Description of Related Art

Solar cells, which are photoelectric devices for converting light (such as solar light) to electric energy, have become more important due to being a renewable energy source and their effectively limitless and eco-friendly characteristics, as compared to other energy sources. The most fundamental structure of a solar cell is a p-n junction type diode and the solar cells may be classified according to the material of an absorber layer.

A general solar cell may have a structure in which electrodes are provided on a front surface that is an absorber layer, and on a rear surface facing the front surface. When an electrode is provided on the front surface, a light receiving area is reduced by an amount as much as the area of the electrode. To address this issue, a back contact structure, in which an electrode is provided on only a rear surface, is used.

SUMMARY

One or more embodiments of the present invention include a solar cell having a back contact structure in which efficiency is improved by controlling a gap between conductive type doped portions, and a method of fabricating the solar cell.

Additional aspects will be set forth in part in the description which follows and, in part, will be apparent from the description, or may be learned by practice of the presented embodiments.

According to one or more embodiments of the present invention, a method of fabricating a solar cell includes forming a doped portion having a first conductive type on a semiconductor substrate, growing an oxide layer on the semiconductor substrate, forming a plurality of recess portions in the oxide layer, further growing the oxide layer on the semiconductor substrate, forming a doped portion having a second conductive type on areas of the semiconductor substrate corresponding to the recess portions, forming a first conductive electrode electrically coupled to the doped portion having the first conductive type, and forming a second conductive electrode on the semiconductor substrate and electrically coupled to the doped portion having the second conductive type, wherein a gap between the doped portions having the first and second conductive types corresponds to a width of the oxide layer formed by further growing the oxide layer.

The method may further include doping first conductive type impurities at a rear surface of the semiconductor substrate at a higher concentration than a front surface of the semiconductor substrate to form a back surface field (BSF), and the front surface may be configured to receive light.

The plurality of recess portions may be formed by forming paste on first portions of the oxide layer, etching exposed second portions of the oxide layer including areas other than the first portions, removing the paste, and forming the plurality of recess portions in areas other than the oxide layer on the doped portion having the first conductive type.

The plurality of recess portions may be between where the doped portion having the first conductive type and the oxide layer are stacked, and where the semiconductor substrate is exposed due to the etching of the exposed second portions to remove parts of the doped portion having the first conductive type.

The oxide layer may be further grown both on the areas where the doped portion having the first conductive type and the oxide layer are stacked, and on the portions where the semiconductor substrate is exposed, thereby causing the oxide layer at the areas where the doped portion having the first conductive type and the oxide layer are stacked to have a thickness in a width direction that is different than a thickness in a height direction.

The thickness of the oxide layer in the width direction at the areas where the doped portion having the first conductive type and the oxide layer are stacked may be greater than a thickness of the oxide layer in the height direction on the portions where the semiconductor substrate was exposed.

The method may further include removing the oxide layer from the portions where the semiconductor substrate was exposed to expose the semiconductor substrate.

The method may further include forming a doped portion having a second conductive type by injecting a dopant into the portions where the semiconductor substrate is exposed to diffuse second conductive impurities in the semiconductor substrate.

The doped portion having the second conductive type and the doped portion having the first conductive type may be formed on a first surface of the semiconductor substrate.

The method may further include forming a capping layer on the semiconductor substrate where the doped portion having the second conductive type is formed, and performing a texturing process to remove the doped portion having the second conductive type from a surface of the semiconductor substrate configured to receive light.

The doped portion having the first conductive type may be covered by the oxide layer, and the areas of the semiconductor substrate corresponding to the recess portions may be between areas of the doped portion having the first conductive type covered by the oxide layer, and a gap corresponding to a thickness of the oxide layer is maintained.

The doped portions having the first and second conductive types may be isolated from each other by the oxide layer.

The doped portion having the first conductive type may be covered by the oxide layer and is electrically coupled to the first conductive electrode via a contact hole in the oxide layer to form a first resistance contact point, and the doped portion having the second conductive type may be diffusely formed in the semiconductor substrate and is electrically coupled to the second conductive electrode, to form a second resistance contact point.

The method may further include sequentially forming a passivation layer and an antireflection layer on a front surface of the semiconductor substrate, the front surface being configured to receive light.

According to one or more embodiments of the present invention, a solar cell includes a doped portion having a first conductive type and a doped portion having a second conductive type on a first surface of a semiconductor substrate, an oxide layer covering the doped portion having the first conductive type, and a first conductive electrode and a second conductive electrode electrically coupled to the doped portion having the first conductive type and the doped portion having the second conductive type, respectively, to form resistance contact points, wherein the doped portion having the first conductive type and the doped portion having the second conductive type are separated from each other by the oxide layer forming a gap therebetween.

The doped portion having the second conductive type may be located in the semiconductor substrate between neighboring areas where the doped portion having the first conductive type and the oxide layer are stacked.

The gap may have a size corresponding to a thickness of the oxide layer covering the doped portion having the first conductive type.

The solar cell may further include a passivation layer and an antireflection layer on a second surface of the semiconductor substrate configured to receive light.

BRIEF DESCRIPTION OF THE DRAWINGS

These and/or other aspects will become apparent and more readily appreciated from the following description of the embodiments, taken in conjunction with the accompanying drawings in which:

FIGS. 1A to 1K sequentially illustrate a method of fabricating a thin film type solar cell according to an embodiment of the present invention, in which:

FIG. 1A is a cross-sectional view illustrating a state after a semiconductor substrate according to an embodiment of the present invention is prepared;

FIG. 1B is a cross-sectional view illustrating a state after an n+ conductive type doped portion is formed in the semiconductor substrate of the embodiment shown in FIG. 1A;

FIG. 1C is a cross-sectional view illustrating a state after an oxide layer (e.g., a silicon dioxide ($SiO_2$) layer) is formed on the semiconductor substrate of the embodiment shown in FIG. 1B;

FIG. 1D is a cross-sectional view illustrating a state after paste is patterned on the semiconductor substrate of the embodiment shown in FIG. 1C;

FIG. 1E is a cross-sectional view illustrating a state after the oxide layer is etched on the semiconductor substrate of the embodiment shown in FIG. 1D;

FIG. 1F is a cross-sectional view illustrating a state after the paste is removed from the semiconductor substrate of the embodiment shown in FIG. 1E;

FIG. 1G is a cross-sectional view illustrating a state after a recess is formed in the semiconductor substrate of the embodiment shown in FIG. 1F;

FIG. 1H is a cross-sectional view illustrating a state after an oxide layer is formed on the semiconductor substrate of the embodiment shown in FIG. 1G;

FIG. 1I is a cross-sectional view illustrating a state after the oxide layer is etched on the semiconductor substrate of the embodiment shown in FIG. 1H;

FIG. 1J is a cross-sectional view illustrating a state after a p+ conductive type doped portion is formed on the semiconductor substrate of the embodiment shown in FIG. 1I;

FIG. 1K is a cross-sectional view illustrating a state after a passivation layer, an antireflection layer, a first conductive electrode, and a second conductive electrode are formed on the semiconductor substrate of the embodiment shown in FIG. 1J;

DETAILED DESCRIPTION

Figure 1A:
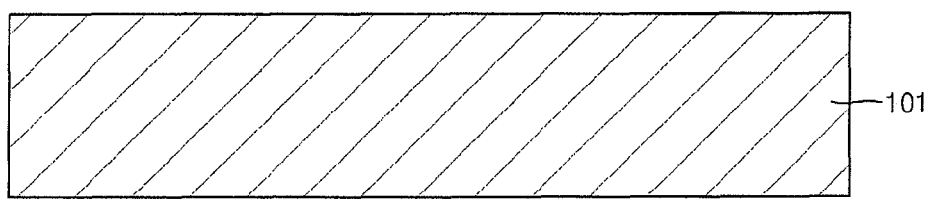

Reference will now be made in detail to embodiments of the present invention, examples of which are illustrated in the accompanying drawings, wherein like reference numerals refer to like elements throughout. In this regard, the embodiments of the present invention may have different forms, and should not be construed as being limited to the descriptions set forth herein. Accordingly, the embodiments are merely described below, by referring to the figures, to explain aspects of embodiments of the present invention.

The terms such as "first" and "second" are used herein merely to describe a variety of constituent elements, but the constituent elements are not limited by the terms. The terms are used only for the purpose of distinguishing one constituent element from another constituent element.

The terms used in the present specification are used for explaining a specific exemplary embodiment(s), not for limiting the present invention. Thus, the expression of singularity in the present specification includes the expression of plurality, unless the context clearly specifies otherwise. Also, the terms such as "include" or "comprise" may be construed to denote a certain characteristic, number, step, operation, constituent element, or a combination thereof, but may not be construed to exclude the existence of, or a possibility of addition of, one or more other characteristics, numbers, steps, operations, constituent elements, or combinations thereof.

Figure 1B:
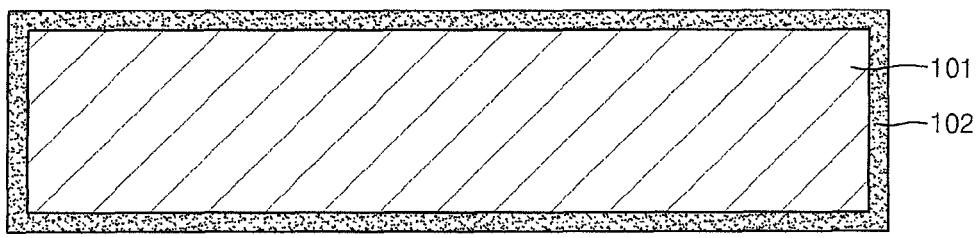
Figure 1C:
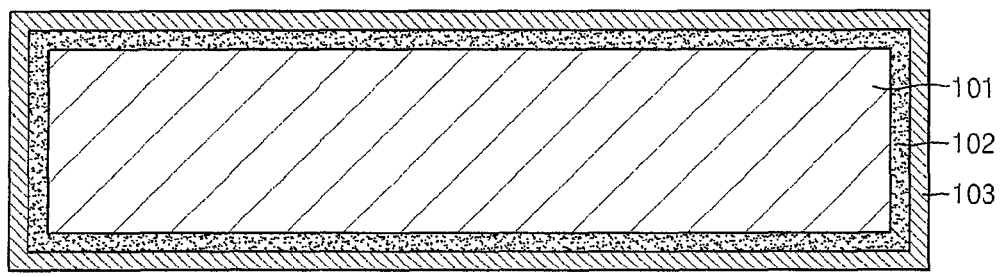
Figure 1D:
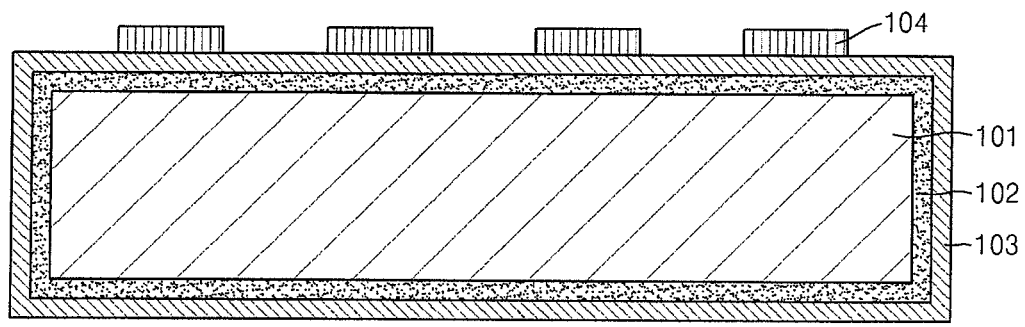
Figure 1E:
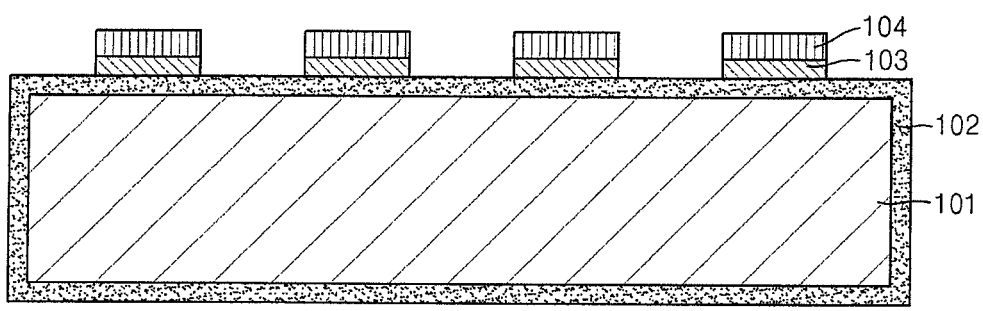
Figure 1F:
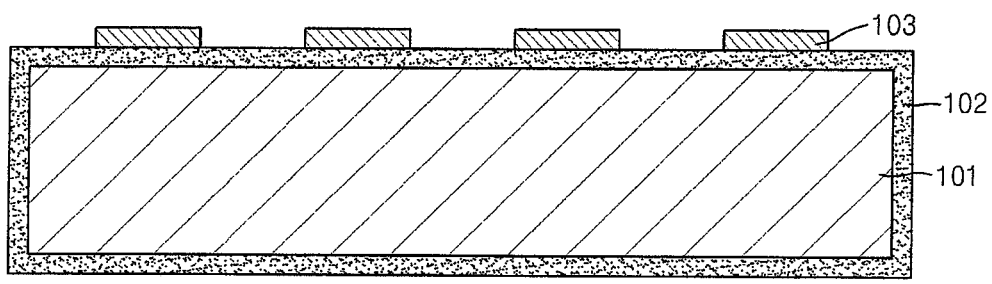
Figure 1G:
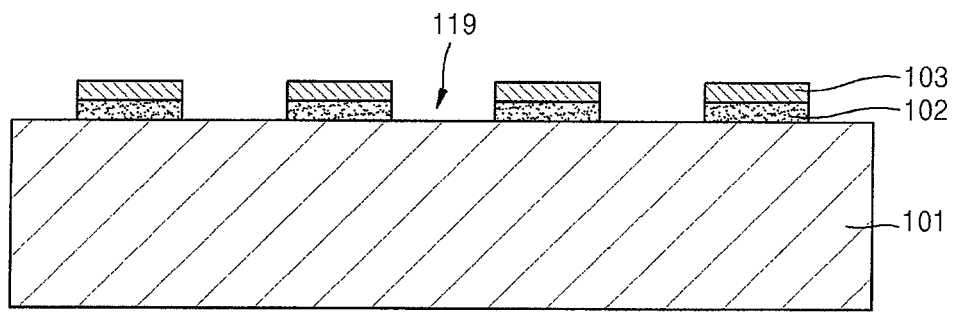
Figure 1H:
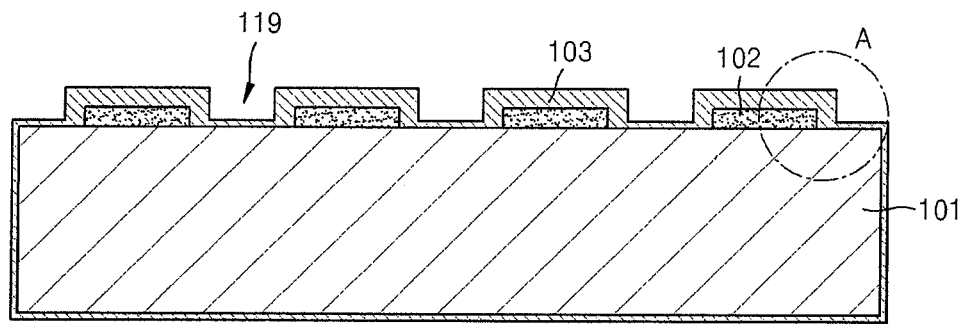
Figure 1I:
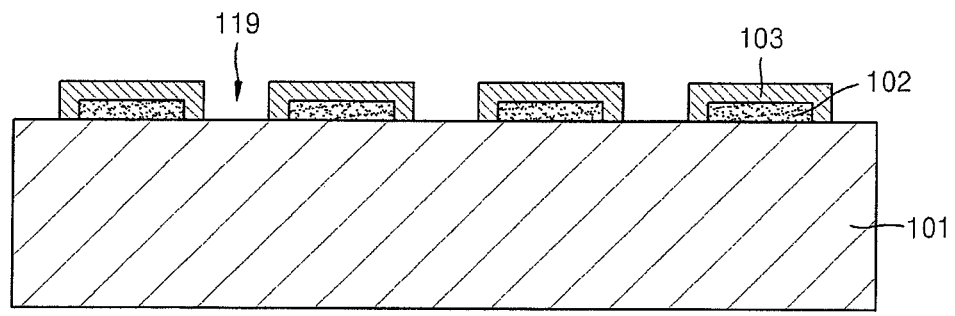
Figure 1J:
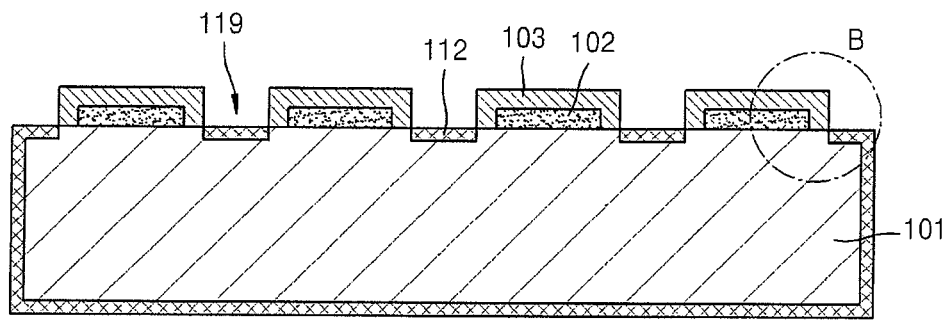
Figure 1K:
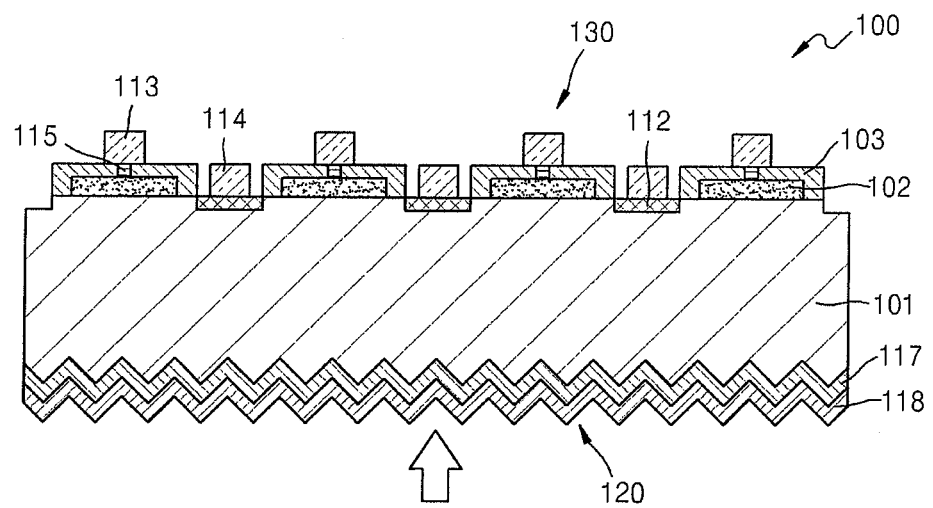

FIG. 1K illustrates a solar cell 100 with a back contact structure according to an embodiment of the present invention. Referring to FIG. 1K, the solar cell 100 includes a semiconductor substrate 101. The semiconductor substrate 101 of the present embodiment is an absorber layer. The semiconductor substrate 101 is a single-crystalline silicon substrate, or may include a polysilicon substrate. An n-type impurity may include a group V element such as phosphorus (P) or arsenic (As).

In the present embodiment, a silicon substrate including n-type impurities is used as the semiconductor substrate 101, although the present invention is not limited thereto. For example, a single-crystalline silicon substrate or a polycrystalline silicon substrate doped with p-type impurities may be used as the semiconductor substrate 101. The p-type impurities may include a group III element such as boron (B), aluminum (Al), or gallium (Ga).

The semiconductor substrate 101 includes a texture structure (e.g., a rough or textured surface). The solar cell 100 has a cross-section of a pyramid shape, or a triangular shape, on a front surface 120 of the semiconductor substrate 101 for receiving light, as indicated by an arrow at the bottom of FIG. 1K. The texture structure of the solar cell 100 may reduce reflection of incident light, increase the length of a light passage in the semiconductor substrate 101, and increase the quantity of absorbed light using internal reflection. Thus, a short-circuit current of the solar cell 100 may be improved.

A passivation layer 117 is formed on the front surface 120 of the semiconductor substrate 101. The passivation layer 117 may include amorphous silicon (a-Si) doped with impurities, or silicon nitride ($SiN_x$). When the passivation layer 117 includes the a-Si doped with impurities, the passivation layer 117 is in a state of being doped with the same conductive impurities as the semiconductor substrate 101, although at a higher concentration than the semiconductor substrate 101.

The passivation layer 117 may improve a carrier collection efficiency by preventing surface recombination of carriers generated in the semiconductor substrate 101. For example, since the passivation layer 117 prevents carriers from moving toward the front surface 120 of the semiconductor substrate 101, the passivation layer 117 may prevent carriers from disappearing as electrons and holes are recombined with each other in the vicinity of the front surface 120 of the semiconductor substrate 101.

An antireflection layer 118 is formed on the passivation layer 117. The antireflection layer 118 reduces or prevents a loss in light absorption by the solar cell 100 due to the reflection of light when solar light is incident. Thus, an efficiency of the solar cell 100 may be improved.

The antireflection layer 118 includes a transparent material, for example, $SiO_x$, $SiN_x$, $SiO_xN_y$, $TiO_x$, ZnO, or ZnS. Although the antireflection layer 118 of the present embodiment is a single layer, the antireflection layer 118 may also be formed by stacking a plurality of layers having different refractive indexes.

Although the passivation layer 117 and the antireflection layer 118 of the present embodiment are separate layers, the present invention is not limited thereto. For example, by forming silicon nitride ($SiN_x$), a function of the passivation layer 117 and a function of the antireflection layer 118 may be simultaneously performed.

An emitter layer 112 is formed on a rear surface 130 of the semiconductor substrate 101. The emitter layer 112 forms a p-n junction with the semiconductor substrate 101, and is doped with p-type or n-type impurities. When the semiconductor substrate 101 is of an n-type, the emitter layer 112 includes p-type impurities. When the semiconductor substrate 101 is of a p-type, the emitter layer 112 includes n-type impurities. A diffusion area is of a stripe-type, or is of a dot-type, the dots having a shape such as, for example, a circle or an oval. In the present embodiment, the emitter layer 112 corresponds to a p+ conductive type doped portion (e.g., a doped portion having a p+ conductive type).

A base layer 102 is formed on the rear surface 130 of the semiconductor substrate 101. The base layer 102 includes impurities that are the same type as that of the semiconductor substrate 101. The base layer 102 is doped with impurities at a higher concentration than that of the semiconductor substrate 101, forming a back surface field (BSF).

The base layer 102 is doped with n-type or p-type impurities. An impurity diffusion area may be of a stripe-type, or may be of a dot-type, such as a circle or an oval. The emitter layer 112 and the base layer 102 are interdigitated with each other on the rear surface 130 of the semiconductor substrate 101. In the present embodiment, the base layer 102 corresponds to an n+ conductive type doped portion (e.g., a doped portion having an n+ conductive type).

A first conductive electrode 113 is formed above the base layer 102. An insulation layer 103 is formed between the base layer 102 and the first conductive electrode 113. The first conductive electrode 113 includes silver (Ag), gold (Au), copper (Cu), aluminum (Al), and an alloy thereof. The first conductive electrode 113 forms an ohmic contact with the base layer 102 via a contact hole 115.

A second conductive electrode 114 is formed on an upper surface of the emitter layer 112, and may include silver (Ag), gold (Au), copper (Cu), aluminum (Al), and/or an alloy thereof. The second conductive electrode 114 forms an ohmic contact with the emitter layer 112.

The insulation layer 103 includes a silicon oxide layer that is an oxide layer grown on the semiconductor substrate 101 formed of silicon. A method of fabricating the solar cell 100 with a back contact structure having the above-described layer is described below.

Referring to FIG. 1A, the semiconductor substrate 101 is prepared. The semiconductor substrate 101 may include a single-crystalline silicon substrate or a polycrystalline silicon substrate. The semiconductor substrate 101 may be a single-crystalline or polycrystalline silicon substrate doped with n-type or p-type impurities. In the present embodiment, the semiconductor substrate 101 includes n-type impurities. The semiconductor substrate 101 may undergo a cleaning process using an acid or alkali liquid to remove physical or chemical impurities adhering to a surface thereof.

Next, as illustrated in FIG. 1B, an n+ conductive type doped portion 102 is formed on a surface of the semiconductor substrate 101. To form a BSF on one surface of the semiconductor substrate 101, the semiconductor substrate 101 is inserted in a diffusion chamber (not shown) and then thermally treated at a high temperature after a gas containing an n-type dopant, for example, $POCl_3$, is injected in the diffusion chamber, thereby forming the n+ conductive type doped portion 102.

Next, as illustrated in FIG. 1C, a silicon dioxide ($SiO_2$) layer 103, which is an oxide layer, is formed on a surface of the semiconductor substrate 101 by growing silicon by a wet oxidation process. The thickness of the $SiO_2$ layer 103 may be about 1000 Å or more. The atmosphere in the diffusion chamber for growing silicon may be an atmosphere of a mixed gas including oxygen ($O_2$) and nitrogen ($N_2$).

After the $SiO_2$ layer 103 is formed, as illustrated in FIG. 1D, paste 104 formed of an organic material is patterned on a rear surface of the semiconductor substrate 101. The paste 104 may be formed, or patterned, by a screen print method, and may be patterned in a stripe shape or a dot shape.

As illustrated in FIG. 1E, the $SiO_2$ layer 103 is etched using a buffered oxide etchant (BOE) solution or a hydrogen fluoride (HF) solution. Accordingly, the $SiO_2$ layer 103 that is exposed after the paste 104 has been patterned is removed from the semiconductor substrate 101.

Next, as illustrated in FIG. 1F, the paste 104 is removed. The paste 104 may be removed by being dipped into a dipping bath (not shown) OF potassium hydroxide (KOH) of a low concentration. Accordingly, the $SiO_2$ layer 103 that is patterned is formed on the semiconductor substrate 101.

After the $SiO_2$ layer 103 is patterned, as illustrated in FIG. 1G, the $SiO_2$ layer 103 is etched by being dipped into a dipping bath of KOH of a high concentration. The n+ conductive type doped portion 102 that is exposed where the $SiO_2$ layer 103 is not patterned is removed from the semiconductor substrate 101.

Accordingly, the n+ conductive type doped portion 102 existing outside an area where the n+ conductive type doped portion 102 and the $SiO_2$ layer 103 are stacked is removed from the semiconductor substrate 101, and thus, a recess portion(s) 119 (where the n+ conductive type doped portion 102 is removed) is formed. The recess portion 119 corresponds to an area formed by a difference in the thickness between a portion where the n+ conductive type doped portion 102 and the $SiO_2$ layer 103 are stacked, and a portion where the surface of the semiconductor substrate 101 is exposed due to the removal of the n+ conductive type doped portion 102 (e.g., the recess portion 119 is the areas where the surface of the semiconductor substrate 101 is exposed between the areas of the oxide layer 103).

The surface of the semiconductor substrate 101 becomes smooth by mixing isopropyl-alcohol (IPA) as an additive in the KOH solution.

Next, as illustrated in FIG. 1H, a second growth of the $SiO_2$ layer 103 is performed on the semiconductor substrate 101 by a wet oxidation process, thereby further increasing the thickness of the $SiO_2$ layer 103. In the growth by the wet oxidation process, a doping concentration, an orientation of a silicon lattice, and a surface roughness of the semiconductor substrate 101 are important. A vertical {010} plane and a smooth surface may be embodied when the recess portion 119 is formed by using a mixed solution (KOH+IPA) of KOH and IPA in the step corresponding to FIG. 1G.

Figure 2:
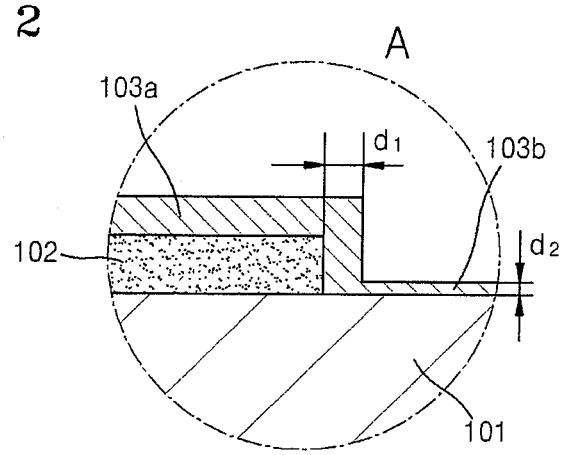
FIG. 2 is an enlarged cross-sectional view of a portion A of FIG. 1H.

Accordingly, the thickness of the $SiO_2$ layer 103 is increased by the second growth. As illustrated in FIG. 2, a first thickness d1 of a $SiO_2$ layer 103a covering the n+ conductive type doped portion 102 (e.g., a thickness in a width direction) is thicker than a second thickness d2 of a $SiO_2$ layer 103b that is grown at an area where the n+ conductive type doped portion 102 is removed (e.g., a thickness in a height direction), that is, an area of a surface of the semiconductor substrate 101 where the recess portion 119 is formed. A growth speed of an oxide layer of the first thickness d1 is about 2.5 to 3 times faster than that of the second thickness d2.

When a dopant (e.g., impurities) is injected in the silicon, vacancies are generated in the silicon, and the impurities and vacancies weaken a combination structure of silicon. As such, oxygen may easily combine with silicon. Thus, the more dopant is injected, the faster the growth speed of an oxide layer will be.

Also, the atmosphere in the diffusion chamber for growing silicon may be a mixed gas atmosphere of oxygen ($O_2$) and nitrogen ($N_2$).

Next, as illustrated in FIG. 1I, the $SiO_2$ layer 103 is etched by using a BOE solution or a HF solution. Accordingly, while removing the $SiO_2$ layer 103b of FIG. 2 in the area where the n+ conductive type doped portion 102 is not formed, the $SiO_2$ layer 103a of FIG. 2 covering the portion where the n+ conductive type doped portion 102 is formed remains.

In other words, since the $SiO_2$ layer 103a covering the portion where the n+ conductive type doped portion 102 is formed grows to be about 2.5 to 3 times thicker than the $SiO_2$ layer 103b in the area where the n+ conductive type doped portion 102 is not formed, an etching process is performed only for a time during which the $SiO_2$ layer 103b in the area where the n+ conductive type doped portion 102 is not formed is removed.

As illustrated in FIG. 1J, a p+ conductive type doped portion 112 is formed on the rear surface of the semiconductor substrate 101. To this end, the semiconductor substrate 101 is inserted in the diffusion chamber and undergoes a thermal treatment at a high temperature after a gas containing a p-type dopant, for example, boron tribromide ($BBr_3$), is injected in the diffusion chamber.

Accordingly, the p-type dopant is diffused in the semiconductor substrate 101, and thus, the p+ conductive type doped portion 112 is formed in the recess portion 119. A boron-rich (Br) layer is formed on a surface of the p+ conductive type doped portion 112. The Br layer may be removed by using HF.

The p+ conductive type doped portion 112 may be formed not only on the rear surface 130 of the semiconductor substrate 101, but also on the front surface 120 and side surfaces of the semiconductor substrate 101, simultaneously. To remove the p+ conductive type doped portion 112, an undoped silicon glass (USG) layer that is a capping layer is deposited on the rear surface 130 of the semiconductor substrate 101. The p+ conductive type doped portion 112 formed on the front surface 120 and side surfaces of the semiconductor substrate 101 is removed by a texturing process using a mixed solution (KOH+IPA) of KOH and IPA.

Figure 3:
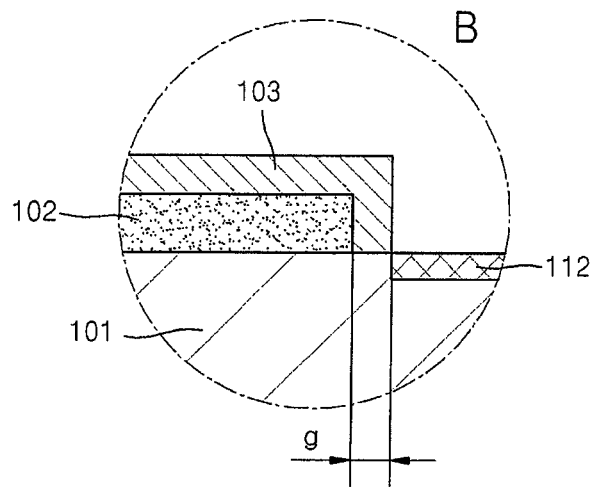
FIG. 3 is an enlarged cross-sectional view of a portion B of FIG. 1J.

Accordingly, as illustrated in FIG. 3, a gap of about several hundreds of angstroms (A) between the n+ conductive type doped portion 102 and the p+ conductive type doped portion 112 is maintained because of the $SiO_2$ layer 103 that covers the n+ conductive type doped portion 102. Since a portion corresponding to the gap g is an area irrelevant to (e.g., that does not contribute to) an efficiency of the solar cell 100 during an operation of the solar cell 100, if the area corresponding to the gap g increases, the efficiency of the solar cell 100 is degraded. Thus, the portion where the gap g is formed may be reduced as much as feasibly possible.

According to the present embodiment, while the gap g between the n+ conductive type doped portion 102 and the p+ conductive type doped portion 112 is reduced to approximately 1/1000 of a conventional gap, isolation of each of the n+ conductive type doped portion 102 and the p+ conductive type doped portion 112 is guaranteed.

Furthermore, a pattern process of forming a separate gap to maintain a gap between the n+ conductive type doped portion 102 and the p+ conductive type doped portion 112 is not needed. As such, since the n+ conductive type doped portion 102 and the p+ conductive type doped portion 112 are formed in a self-alignment method, the n+ conductive type doped portion 102 and the p+ conductive type doped portion 112 each may be formed to have a fine width.

In addition to the method of using $BBr_3$, the method of forming the p+ conductive type doped portion 112 is not limited to any one of the methods of forming the p+ conductive type doped portion 112 on the semiconductor substrate 101. In other words, boron silicate glass (BSG) may be deposited on the semiconductor substrate 101 by an atmospheric pressure chemical vapor deposition (APCVD) method, and the semiconductor substrate 101 may undergo a thermal treatment at a high temperature. Accordingly, the p+ conductive type doped portion 112 is formed in the recess portion 119 as the p-type dopant is diffused in the semiconductor substrate 101. The BSG is deposited on one surface of the semiconductor substrate 101 by using a mask, etc. After the p+ conductive type doped portion 112 is formed, the BSG at the other portion is removed by using HF. Also, the p+ conductive type doped portion 112 may be formed by a laser method.

Figure 4A:
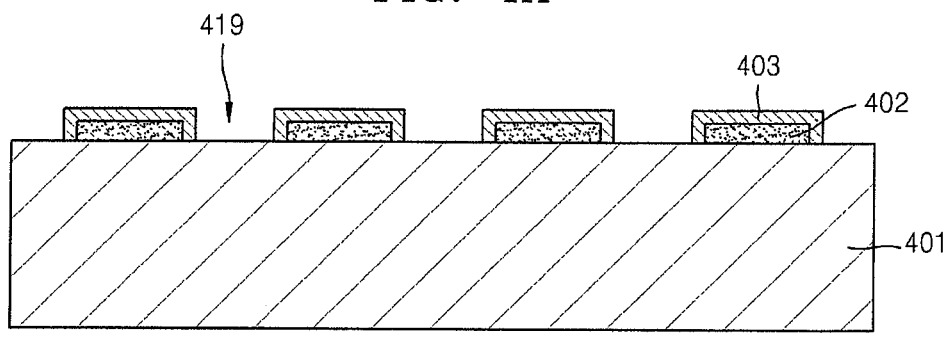
FIG. 4A is a cross-sectional view illustrating a state after an oxide layer is formed on a substrate according to another embodiment of the present invention.
Figure 4B:
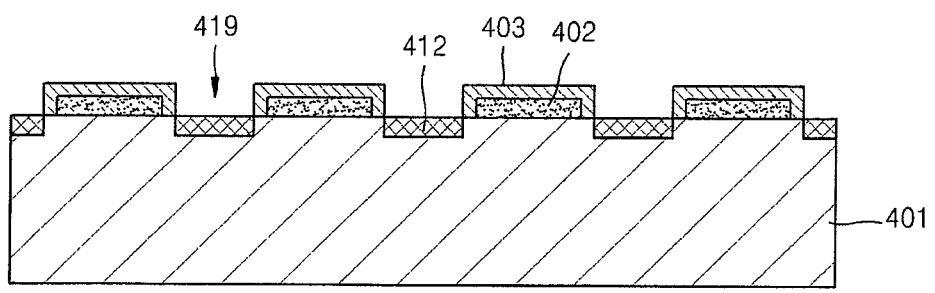
FIG. 4B is a cross-sectional view illustrating a state after a p+ conductive type doped portion is formed on the substrate of the embodiment shown in FIG. 4A.

As illustrated in FIG. 4A, an n+ conductive type doped portion 402, which may be patterned on a semiconductor substrate 401 in the above method, and a $SiO_2$ layer 403 covering the n+ conductive type doped portion 402 are patterned. Then, as illustrated in FIG. 4B, a boron material is coated on the semiconductor substrate 401, and a laser may be irradiated onto the boron material so that a p-type dopant is diffused in the semiconductor substrate 401 through a recess portion 419 to form the p+ conductive type doped portion 412.

As described above, the n+ conductive type doped portion 402 and the p+ conductive type doped portion 412 maintaining a narrow gap due to the oxide layer may be formed to be interdigitated with each other on a rear surface of the semiconductor substrate 401 through the above processes.

Referring back to FIG. 1K, a pyramid, or saw tooth, surface is formed on the front surface 120 of the semiconductor substrate 101 through the texturing process. To this end, the semiconductor substrate 101 uses the mixed solution (KOH+IPA) of KOH and IPA.

Next, the passivation layer 117 and the antireflection layer 118 are sequentially formed on the front surface 120 of the semiconductor substrate 101 to have the pyramid/saw tooth surface formed by the texturing process. The cleaning of the semiconductor substrate 101 may be performed before the passivation layer 117 is formed.

The passivation layer 117 may include amorphous silicon doped with impurities. For example, the passivation layer 117 may be formed as an n+ layer of a high concentration on the front surface 120 of the n-type semiconductor substrate 101. The passivation layer 117 formed as described above may form a front surface field (FSF) to reduce loss due to recombination of holes and electrons.

Alternatively, the passivation layer 117 may include silicon nitride ($SiN_x$). The passivation layer 117 may be formed by a plasma-enhanced chemical vapor deposition (PECVD) method.

Since the passivation layer 117 is formed at the front surface 120 of the semiconductor substrate 101, which is a light-receiving surface, the passivation layer 117 may adjust a band gap to reduce light absorption. For example, by adding an additive, the band gap is increased so that light absorption is reduced and incident light may be absorbed into the semiconductor substrate 101.

The antireflection layer 118 is formed on the passivation layer 117, and may include silicon oxide ($SiO_x$), silicon nitride ($SiN_x$), silicon oxynitride ($SiO_xN_y$), etc., and may be formed by a CVD method, a sputtering method, a spin coating method, etc. For example, the antireflection layer 118 may be formed as a single layer of $SiO_x$, $SiN_x$, or $SiO_xN_y$, or a combination layer thereof.

Although the passivation layer 117 and the antireflection layer 118 are described as independently formed in the present embodiment, the present invention is not limited thereto. For example, the passivation layer 117 and the antireflection layer 118 may be formed as a single layer, such as by forming a layer containing $SiN_x$, wherein a passivation effect and an antireflection effect may be obtained.

The first conductive electrode 113 and the second conductive electrode 114 are formed on the n+ conductive type doped portion 102 and the p+ conductive type doped portion 112, respectively. To this end, the contact hole 115 is formed in the $SiO_2$ layer 103. The contact hole 115 is formed in an area corresponding to the n+ conductive type doped portion 102. The contact hole 115 may be formed by using laser or screen printing using an etching paste.

Next, conductive paste such as, for example, silver (Ag), gold (Au), copper (Cu), aluminum (Al), or nickel (Ni) is pattern-printed on the rear surface 130 of the semiconductor substrate 101 by screen printing or plating, and is thermally treated. Accordingly, the first conductive electrode 113 forming a resistance contact point with respect to the n+ conductive type doped portion 102 is coupled to the n+ conductive type doped portion 102. The second conductive electrode 114 forming a resistance contact point with respect to the p+ conductive type doped portion 112 is coupled to the p+ conductive type doped portion 112. Thus, the solar cell 100 having a back contact structure in which the gap between the n+ conductive type doped portion 102 and the p+ conductive type doped portion 112 is reduced may be fabricated through the above processes.

The gap in the solar cell 100 according to an experiment by the present applicant is shown below in Table 1.

TABLE 1

|  | Comparative example (μm) | Present embodiment (μm) |
| --- | --- | --- |
| Emitter area | 1550 | 1750 |
| Gap | 100 | 0.1 |

In the comparative example, a gap between a conventional n+ conductive type doped portion and a conventional p+ conductive type doped portion is formed by performing an additional and separate gap pattern process after a screen printing method and a wet chemical process. In the present embodiment, the gap between the n+ conductive type doped portion 102 and the p+ conductive type doped portion 112 is maintained by the $SiO_2$ layer 103.

Referring to Table 1, in the comparative example, the width of an emitter area corresponding to the p+ conductive type doped portion is about 1550 μm. In the present embodiment, the width of an emitter area is about 1750 μm, which is about 200 μm wider than the width of the emitter area in the comparative example. Also, in the comparative example, the gap between the n+ conductive type doped portion and the p+ conductive type doped portion is about 100 μm. In the present embodiment, the gap between the n+ conductive type doped portion 102 and the p+ conductive type doped portion 112 is about 0.1 μm. Thus, it may be seen that the gap of the present embodiment is reduced to about 1/1000th of the size of the gap of the comparative example.

As such, since the gap between the n+ conductive type doped portion 102 and the p+ conductive type doped portion 112 does not contribute to an efficiency of the solar cell 100, and since a size of the gap is reduced, the efficiency of the solar cell 100 may be improved.

As described above, in the solar cell and the method of fabricating a solar cell according to embodiments of the present invention, since the gap between the first and second conductive type doped portions formed on the rear surface of a solar cell having a back contact structure is narrow, due to using a difference in the growth speed of portions of an oxide layer according to the first and second conductive layer doping concentrations, an efficiency of the solar cell may be improved.

Further, since an additional pattern process for adjusting the gap between the first and second conductive type doped portions is not needed, a fabrication process time of a solar cell is reduced, and fabrication costs may be reduced.

Further, since self-alignment is possible, a shunt path due to an error in alignment is not generated.

Further, since a width of the first conductive type doped portion and a width of the second conductive type doped portion are much reduced, a large number of interdigitated lines may be formed in a semiconductor substrate.

It should be understood that the exemplary embodiments described herein should be considered in a descriptive sense only and not for purposes of limitation. Descriptions of features or aspects within each embodiment should typically be considered as available for other similar features or aspects in other embodiments.

While embodiments of the present invention has been particularly shown and described with reference to exemplary embodiments thereof, it will be understood by one of ordinary skill in the art that various changes in form and details may be made therein without departing from the spirit and scope of the present invention as defined by the following claims, and their equivalents.

What is claimed is:

1. A method of fabricating a solar cell, the method comprising:
    forming a doped portion having a first conductive type on a semiconductor substrate;
    growing an first oxide layer on the semiconductor substrate;
    forming a plurality of recess portions in the first oxide layer and the doped portion having the first conductivity type to expose the semiconductor substrate;
    growing a second oxide layer on the first oxide layer, on the sidewalls of the plurality of recess portions, and on the exposed semiconductor substrate inside the recess portions;
    removing a first portion of the second oxide layer to expose the semiconductor substrate while maintaining a second portion of the second oxide layer on the sidewalls of the plurality of recess portions;
    forming a doped portion having a second conductive type on areas of the semiconductor substrate corresponding to the recess portions inside the second portion of the second oxide layer on the sidewalls of the plurality of recess portions;
    forming a first conductive electrode electrically coupled to the doped portion having the first conductive type; and
    forming a second conductive electrode on the semiconductor substrate electrically coupled to the doped portion having the second conductive type,
    wherein a gap between the doped portions having the first and second conductive types corresponds to a width of the second portion of the second oxide layer formed on the sidewalls of the recessed portions.

2. The method of claim 1, further comprising doping first conductive type impurities at a rear surface of the semiconductor substrate at a higher concentration than a front surface of the semiconductor substrate to form a back surface field (BSF),
    wherein the front surface is configured to receive light.

3. The method of claim 1, wherein the plurality of recess portions are formed by:
    forming paste on first portions of the first oxide layer;
    etching exposed second portions of the first oxide layer comprising areas other than the first portions of the first oxide layer;
    removing the paste; and
    forming the plurality of recess portions in areas other than the first oxide layer on the doped portion having the first conductive type.

4. The method claim 3, wherein the plurality of recess portions are between where the doped portion having the first conductive type and the first oxide layer are stacked, and where the semiconductor substrate is exposed due to the etching of the exposed second portions to remove parts of the doped portion having the first conductive type.

5. The method of claim 4, wherein the second oxide layer is grown both on the areas where the doped portion having the first conductive type and the first oxide layer are stacked and on the portions where the semiconductor substrate is exposed, thereby causing the stacked first oxide layer and second oxide layer to be formed at the areas over the doped portion having the first conductive type to have a thickness that is different than a thickness of the second oxide layer on the portions where the semiconductor substrate was exposed.

6. The method of claim 5, wherein the thickness of the stacked first oxide layer and the second oxide layer at the areas over the doped portion having the first conductive type is greater than a thickness of the second oxide layer on the portions where the semiconductor substrate was exposed.

7. The method of claim 1, wherein the forming the doped portion having the second conductive type is formed by injecting a dopant into the portions where the semiconductor substrate is exposed by the second oxide layer to diffuse second conductive impurities in the semiconductor substrate.

8. The method of claim 7, wherein the doped portion having the second conductive type and the doped portion having the first conductive type are formed on a first surface of the semiconductor substrate.

9. The method of claim 7, further comprising forming a capping layer on the semiconductor substrate where the doped portion having the second conductive type is formed, and
    performing a texturing process to remove the doped portion having the second conductive type from a surface of the semiconductor substrate configured to receive light.

10. The method of claim 1, wherein the doped portion having the first conductive type is covered by the first oxide layer, and
    wherein the areas of the semiconductor substrate corresponding to the recess portions are between areas of the doped portion having the first conductive type covered by the first oxide layer and a gap corresponding to a thickness of the second oxide layer on the sidewalls of the recessed portions.

11. The method of claim 10, wherein the doped portions having the first and second conductive types are isolated from each other by the second oxide layer.

12. The method of claim 1, wherein the doped portion having the first conductive type is electrically coupled to the first conductive electrode via a contact hole through the first oxide layer and the second oxide layer to form a first resistance contact point, and
    wherein the doped portion having the second conductive type is diffusely formed in the semiconductor substrate and is electrically coupled to the second conductive electrode to form a second resistance contact point.

13. The method of claim 1, further comprising sequentially forming a passivation layer and an antireflection layer on a front surface of the semiconductor substrate, the front surface being configured to receive light.

* * * * *